United States Patent
Yuan et al.

(10) Patent No.: US 8,324,106 B2
(45) Date of Patent: Dec. 4, 2012

(54) METHODS FOR FABRICATING A PHOTOLITHOGRAPHIC MASK AND FOR FABRICATING A SEMICONDUCTOR INTEGRATED CIRCUIT USING SUCH A MASK

(75) Inventors: Lei Yuan, Sunnyvale, CA (US);
Jongwook Kye, Pleasanton, CA (US);
Harry J. Levinson, Saratoga, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 51 days.

(21) Appl. No.: 13/079,647

(22) Filed: Apr. 4, 2011

(65) Prior Publication Data
US 2012/0252199 A1    Oct. 4, 2012

(51) Int. Cl.
*H01L 21/311* (2006.01)
(52) U.S. Cl. ........ 438/694; 438/780; 430/311; 430/319; 257/E21.023
(58) Field of Classification Search .................. 438/694, 438/780; 430/311, 319
See application file for complete search history.

(56) References Cited

U.S. PATENT DOCUMENTS

| | | | |
|---|---|---|---|
| 2004/0091790 A1* | 5/2004 | Chen et al. | 430/5 |
| 2005/0124088 A1* | 6/2005 | Chen | 438/30 |
| 2006/0046160 A1* | 3/2006 | Wallace et al. | 430/5 |
| 2010/0055882 A1* | 3/2010 | Imhoff et al. | 438/481 |
| 2010/0068654 A1* | 3/2010 | Fonseca et al. | 430/322 |
| 2011/0006401 A1* | 1/2011 | Chen et al. | 257/618 |
| 2011/0119642 A1* | 5/2011 | Agarwal et al. | 716/50 |
| 2011/0230999 A1* | 9/2011 | Chen et al. | 700/105 |
| 2012/0070064 A1* | 3/2012 | Gallagher et al. | 382/144 |

* cited by examiner

*Primary Examiner* — Alexander Ghyka
(74) *Attorney, Agent, or Firm* — Ingrassia Fisher & Lorenz, P.C.

(57) ABSTRACT

Methods are provided for designing a photolithographic mask and for fabricating a semiconductor IC using such a mask. In accordance with one embodiment a method for fabricating a semiconductor IC includes determining a design target for a region within the IC. An initial mask geometry is determined for the region having a mask opening and a mask bias relative to the design target. A sub-resolution edge ring having a predetermined, fixed spacing to an edge of the mask opening is inserted into the mask geometry and a lithographic mask is generated. A material layer is applied overlying a semiconductor substrate upon which the IC is to be fabricated and a layer of photoresist is applied overlying the material layer. The layer of photoresist is exposed through the lithographic mask and is developed. A process step is then performed on the material layer using the layer of photoresist as a mask.

9 Claims, 6 Drawing Sheets

METHODS FOR FABRICATING A PHOTOLITHOGRAPHIC MASK AND FOR FABRICATING A SEMICONDUCTOR INTEGRATED CIRCUIT USING SUCH A MASK

TECHNICAL FIELD

The present invention generally relates to methods for fabricating a photolithographic mask and for fabricating semiconductor integrated circuits (ICs) using such a mask, and more particularly relates to photolithographic masks including a sub-resolution edge ring and to methods for fabricating semiconductor ICs using such masks.

BACKGROUND

The trend in the semiconductor industry is toward more and more complexity on each integrated circuit (IC) produced. The increased complexity results in an increase in the number of devices, transistors and the like, required to implement the circuits. As the number of devices increases there is a demand for smaller feature sizes; that is, smaller lines and smaller spaces between lines.

Extensive use is made of photolithography to transfer images from a photo mask to the surface of a semiconductor substrate upon which the IC is being fabricated. As the feature size is reduced it becomes more difficult to reliably reproduce the mask images on the substrate. Reproducing feature sizes in the range of tens of nanometers (nm) requires high numerical aperture (NA) optics and off-axis illumination. Unfortunately such techniques for dealing with small feature sizes can lead to difficulties with reproducing large features. For example, when trying to reproduce wide, spaced apart lines on a semiconductor substrate using optical tools suited for small features, a dip in image intensity between the lines can result in underexposure and a resist scum. The resist scum, in turn, can result in unacceptable process yield.

Accordingly, it is desirable to provide methods for fabricating photolithographic masks that overcome the above-mentioned problems. In addition, it is desirable to provide methods for fabricating semiconductor integrated circuits at high yields. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating a semiconductor IC. In accordance with one embodiment the method includes determining a design target for a region within the IC. An initial mask geometry is determined for the region, the region having a mask opening responsive to the design target. A sub-resolution edge ring having a predetermined, fixed spacing to an edge of the mask opening is inserted into the mask geometry, a mask bias is inserted to adjust the mask opening, and a lithographic mask is generated. A material layer is applied overlying a semiconductor substrate upon which the IC is to be fabricated and a layer of photoresist is applied overlying the material layer. The layer of photoresist is exposed through the lithographic mask and is developed. A process step is then performed on the material layer using the layer of photoresist as a mask.

In accordance with a further embodiment a method for fabricating a semiconductor IC includes generating a lithographic mask, the mask including a transparent region bounded by an opaque region and having a transition region juxtaposed between the transparent region and the opaque region. The transition region has a transmission characteristic between transparent and opaque. A layer of material is formed overlying a semiconductor substrate upon which the IC is to be fabricated and a layer of photoresist is applied overlying the layer of material. The layer of photoresist is exposed through the lithographic mask and is developed. A process step is performed on the layer of material using the layer of photoresist as a mask.

In accordance with a further embodiment a method is provided for fabricating a photolithographic mask. The method includes determining a design target for a space between two objects and determining a mask opening necessary for resolving the design target. A fixed spacing from an edge of the mask opening is determined for inserting a sub-resolution edge ring and a photolithographic mask is generated that includes the mask opening and the sub-resolution edge ring.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Photolithographic processing is an important tool in the fabrication of semiconductor devices such as semiconductor integrated circuits (ICs). In the photolithographic process a pattern is transferred to a layer of photoresist that overlies the surface of a semiconductor wafer by projecting illumination through a patterned mask so that the illumination exposes portions of the layer of photoresist. If the photoresist is a positive photoresist the illumination causes a chemical change in the illuminated areas making them soluble in a photoresist developer. After applying a developer to the exposed photoresist the transferred pattern remains on the substrate where it can be used as a mask. The mask can be used as an etch mask, ion implantation mask, or the like in fabricating the semiconductor IC.

The mask used in the photolithography process is a plate of quartz or other transparent material upon which a pattern of opaque shapes is formed. A layer of chrome or other opaque material is deposited on the transparent plate and then is etched to form the desired shapes. The shapes formed on the transparent plate are not necessarily identical to the shapes that are to be transferred to the layer of photoresist. When fabricating ICs having very small feature size, for example lines and spaces having dimensions in the tens of nanometers (nm), shapes on the mask are distorted when they are projected onto the layer of photoresist because of interference, diffraction, reflection, and the like. The optical distortions cause variations that are dependent on the density, size and location of nearby features. Some of the distortions result from the optical systems that must be used to resolve the very small features. These include the use of high numerical aperture equipment with the attendant short depth of field and the use of strong off-axis illumination. Several techniques are know and widely used to correct for some of these distortions. For example, mask bias is used to adjust the size of an opening on the mask beyond the design target. Sub-resolution assist features (SRAF) which will be discussed in more detail below can also be added to a mask pattern. The SRAF acts to improve the depth of focus but is too small for the optics to resolve on the layer of photoresist.

Figure 1:
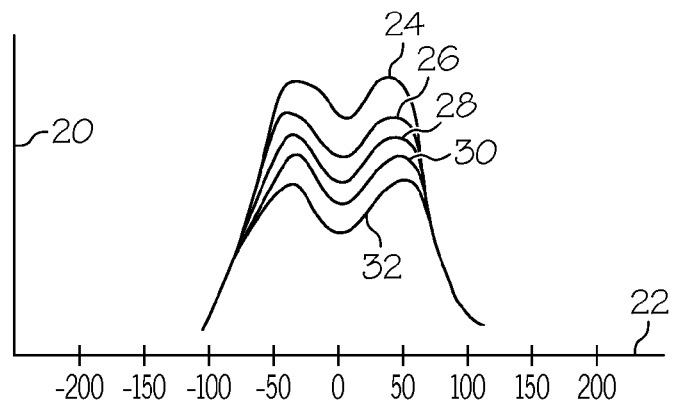
FIG. 1 depicts image intensity dip as a function of emission properties.

One problem that is not addressed by mask bias or by SRAF is that of image intensity dip, also known as image sink, encountered in the space between large lines in off-axis illumination. The optics and techniques necessary to process small features have an unintended effect on large features. On the typical high density IC many if not most of the devices on the circuit will be designed with minimum feature size, say 40 nm or less. Some devices in the IC, however, will be designed with larger feature sizes. For example, adjacent long channel field effect transistors (FETs) can be designed with gate spacing in the range of 140 nm and with a pitch (space plus line width) of 500 nm. FIG. 1 illustrates the problem of image intensity dip when processing such devices with minimum feature size optics.

FIG. 1 depicts plots of image intensity along vertical axis 20 against position on a substrate along horizontal axis 22. The situation depicted illustrates the problem of patterning an opening having a design width of 140 nm between two wide opaque lines. This could be, for example, the situation in which two polycrystalline silicon gates are separated by a 140 nm opening in an IC having other devices of minimum feature size. To fabricate an IC having such a gate structure a layer of polycrystalline silicon is deposited overlying the surface of the semiconductor substrate and a layer of positive photoresist is applied overlying the polycrystalline silicon. Other layers such as an etch stop layer, a planarizing layer and an antireflective coating (ARC) layer may also be applied, but those layers are well known in the industry and need not be discussed in detail. Ideally the layer of photoresist is exposed with illumination (light) passing through a photo mask having an opening of 140 nm width. The exposed photoresist is developed and the remaining unexposed photoresist is left as an etch mask to by used to etch the underlying polycrystalline silicon to form the designed gates. FIG. 1 illustrates the simulated image intensity at the photoresist layer for NA=1.35 as a function of sigma, a measure of an emission parameter of the incident light. There are a number of lithography simulation tools available, such as ProLith available from KLA-Tencor in San Jose Calif., that can be used to provide such simulation. Higher values of sigma are needed for smaller size features. Curve 24 is for a low value of sigma, curve 26 is for a slightly higher sigma, and the value of sigma increases monotonically with curves 28, 30, and 32 with curve 32 having the greatest value of sigma. The significance of the simulation is that there is a dip in image intensity in the center of the space that is to be removed to form the etch mask. The result of having an image intensity dip is that the photoresist in the center of the space may not be adequately exposed, will not be adequately developed, and interferes with the etching of the polycrystalline silicon. The result may be undesired device source-drain connections, degraded source or drain contacts, or other increased defects that degrade yield of the device.

Figure 2:
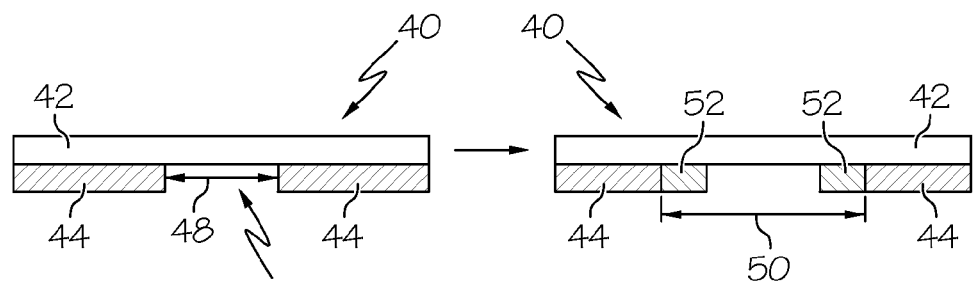
FIG. 2 illustrates, in cross section a lithographic mask having a transition region.

The left portion of FIG. 2 illustrates, in cross section, a conventional binary mask 40 that includes a transparent plate 42 such as a quartz plate and an opaque layer 44, such as a chrome layer, that is patterned to leave a transparent mask opening 46. The transparent mask opening has a width indicated by double headed arrow 48 that corresponds to the design target; that is, the desired space between two lines such as the polycrystalline gates discussed with respect to FIG. 1. The right portion of FIG. 2 illustrates schematically, in cross section, a portion of the photolithographic mask as modified in accordance with one embodiment designed to reduce the image intensity dip illustrated in FIG. 1. First, a partially transmissive material edge ring 52 has been added as a transition region at the edges of the mask opening, that is, in relation to the design target. Second, mask bias has been applied to the mask opening to increase the spacing between opaque regions to a width indicated by double headed arrow 50. The mask bias may include a rule based initial biasing followed by a model based or simulation based mask biasing. Preferably the partially transmissive material has a transmission with respect to the illuminating radiation of about 50%. The mask thus includes a transparent portion 42, an opaque portion 44, and an edge ring portion 52 having transmission properties between transparent and opaque. The optimum width of the mask bias as well as the optimum width of the partially transmissive material edge ring 52 can be determined by modeling using a lithographic modeling tool.

Figure 3:
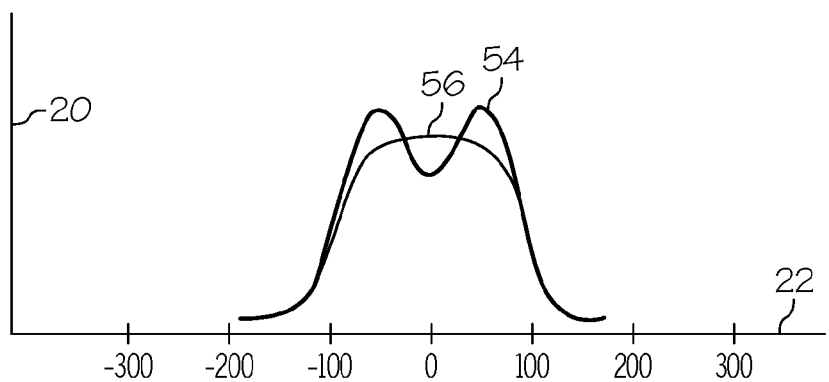
FIG. 3 illustrates simulation results indicating the effectiveness of using the mask of FIG. 2.

FIG. 3 illustrates simulation results indicating the effectiveness of using a partially transmissive material transition edge ring 52 at the edges of the mask opening. Again, image intensity is plotted along vertical axis 20 and position on a substrate is plotted along horizontal axis 22. Curve 54 indicates the image intensity dip that is expected with a conventional binary mask and curve 56 indicates the image intensity, without a dip, that can be achieved with a partially transmissive transition edge ring 52. Adding a partially transmissive transition edge ring can substantially eliminate the image intensity dip, but requires a new mask material and mask fabrication process. Fabricating a photolithographic mask having a partially transmissive transition edge ring requires first using conventional technology to deposit and etch chrome or other opaque material. Then a second layer of partially transmissive material must be deposited and patterned to form the partially transmissive edge ring.

Figure 4:
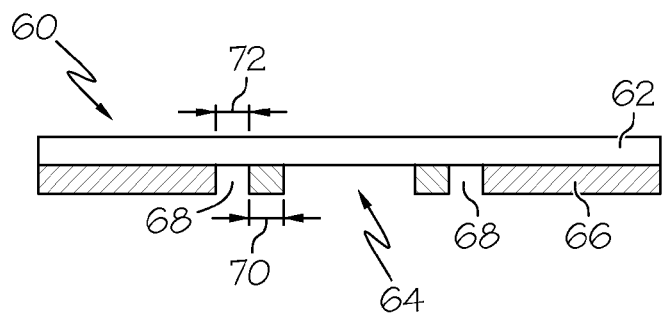
FIG. 4 illustrates, in cross section, a lithographic mask having a sub-resolution edge ring.

In accordance with another embodiment, as illustrated in FIG. 4, a reduction in image intensity dip can be realized with a sub-resolution edge ring mask 60. The desired reduction in image intensity dip is achieved with this embodiment without the mask fabrication complications of adding a partially transmissive material. Mask 60, illustrated in cross section and formed on a transparent substrate 62, includes a transparent opening 64 that, in this FIGURE, has already been adjusted for mask bias and an opaque portion 66. Mask 60 also includes a sub-resolution edge ring 68 that is spaced apart from the transparent mask opening by a predetermined spacing indicated by arrows 70. The spacing of the sub-resolution edge ring from the edge of the mask opening is fixed and does not vary even with adjustments in the mask bias. Sub-resolution edge ring 68 has a width indicated by arrows 72. The edge ring width is small enough that the edge ring is sub-resolution; that is, the edge ring cannot be resolved and cannot be printed on the underlying photoresist layer by the optics employed in exposing the photoresist through the mask. The width of the transparent sub-resolution edge ring preferably is substantially the same as the spacing of the edge ring from the mask opening. The combination of a transparent edge ring separated from the edge of the mask opening by an opaque spacer, each having substantially the same width, provides a transition region that is substantially the same as the partially transmissive edge ring illustrated in FIG. 2. Either the partially transmissive edge ring 52 or the sub-resolution edge ring 68 serves to smooth the transition at the edge of the mask opening. Instead of an abrupt transition from fully transparent to fully opaque the edge ring provides a region of intermediate transmission. Optimum values for the edge ring width and spacing from the mask opening can be determined by simulation using one of the commercially available lithography simulation tools.

Figure 5:
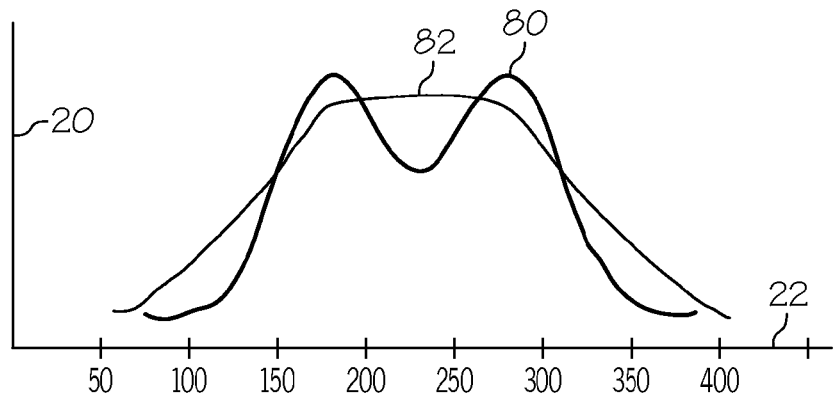
FIG. 5 illustrates simulation results indicating the effectiveness of using the mask of FIG. 4.

FIG. 5 illustrates simulation results indicating the effectiveness of using a sub-resolution edge ring mask 60 having a sub-resolution edge ring 68 spaced apart by a fixed and predetermined distance from the edges of the mask opening. Again, image intensity is plotted along vertical axis 20 and position on a substrate is plotted along horizontal axis 22. Curve 80 indicates the image intensity dip that is expected with a conventional binary mask and curve 82 indicates the image intensity, substantially without a dip, that can be achieved with a sub-resolution edge ring 68. Curve 80 illustrates the effect that a transparent sub-resolution edge ring having a width of 15 nm spaced apart from the mask opening by a distance of 15 nm has in reducing the image intensity dip when the space has a width of 140 nm and the line has a width of 300 nm. The inventors have discovered that a sub-resolution edge ring of this width and spacing is effective for a range of line and space widths. For example, an edge ring width/edge ring spacing of 15 nm/15 nm is effective for a range of spaces from about 120 nm to about 180 nm under the investigated lithography illumination conditions. The optimal ring width/ring spacing may range from about 15 nm/15 nm to about 30 nm/30 nm depending on the exact target line and space dimensions as well as illumination conditions.

As noted, a sub-resolution edge ring of a given width and spacing is effective for reducing image intensity dip for a range of line widths and spacing widths. If the IC being fabricated has structures that have widths that fall outside the range, it may be necessary to use two or more sub-resolution edge ring widths and spacings. In accordance with an embodiment that addresses that situation, a mask is generated that has distinct regions to address the different circuit requirements. In different portions of the mask there are different transparent mask openings, each bounded by opaque areas. The transparent openings are determined by simulation to result in desired design targets. A transition region, for example a transparent sub-resolution edge ring is inserted in juxtaposition to each of the mask openings. Each transparent sub-resolution edge ring has a width and is spaced from its corresponding mask opening by an opaque region having a fixed width that is determined by lithographic simulation to reduce the image intensity dip associated with the width and pitch of the corresponding mask opening.

Figure 6:
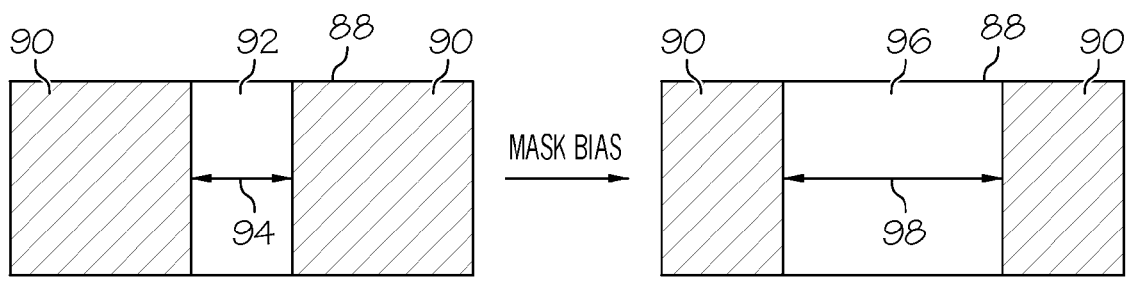
FIGS. 6-9 illustrate schematically, in top view, a progression of mask generation techniques.

FIGS. 6-9 illustrate schematically, in top view, a progression of mask generation techniques that serve to further illustrate the various embodiments of the invention. FIG. 6 illustrates a conventional approach to mask fabrication. In mask 88 the shaded portions 90 represent lines to be reproduced on the semiconductor substrate. Region 92, having a width indicated by double headed arrow 94 is the design target, the desired spacing between lines 90. Mask biasing is applied to achieve the design target and results in a mask opening 96 having a width indicated by double headed arrow 98. The amount of mask bias is determined by simulation.

Figure 7:
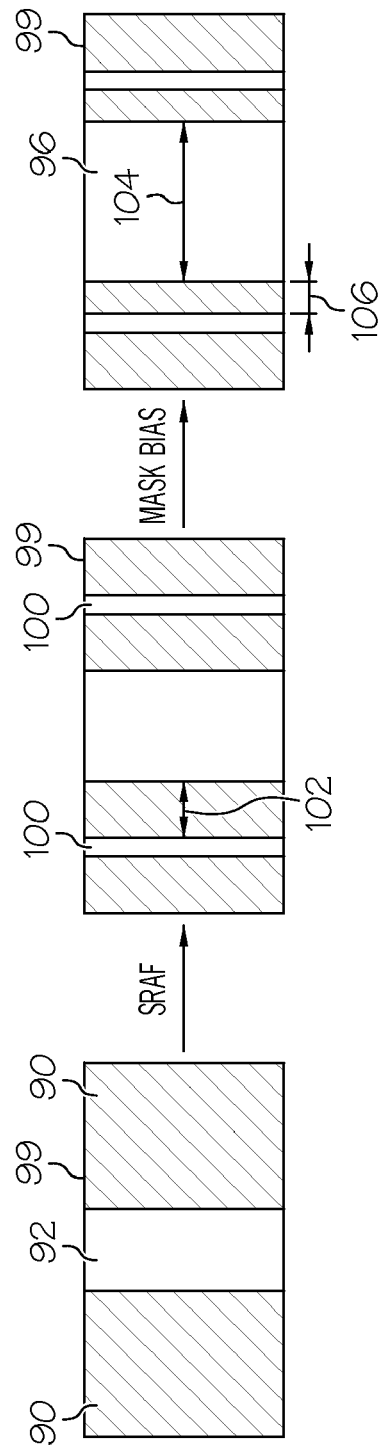

FIG. 7 illustrates an additional conventional approach to mask fabrication in which sub-resolution assist features (SRAF) are employed in a mask 99. SRAF is a well know technique used in mask fabrication and is governed by well know SRAF rules. The mask fabrication begins as in FIG. 6 by defining a design target. SRAF 100 is then inserted in accordance with the SRAF rules which specify that the sub-resolution features are positioned at a fixed distance from the design target, for example at a distance indicated by the double headed arrow 102. Mask design continues by applying mask biasing. The amount of mask bias is usually unknown during SRAF insertion, but as illustrated, results in a mask opening indicated by double headed arrow 104. As a result of the placement of the SRAF at a distance from the design target and subsequent mask biasing, the distance of the SRAF from the edge of the mask opening, indicated by arrows 106 is not controlled and is not known in advance. The unknown spacing of the SRAF from the edge of the mask opening cannot provide a reliable and repeatable smoothing of the transition from opaque line to transparent space.

Figure 8:
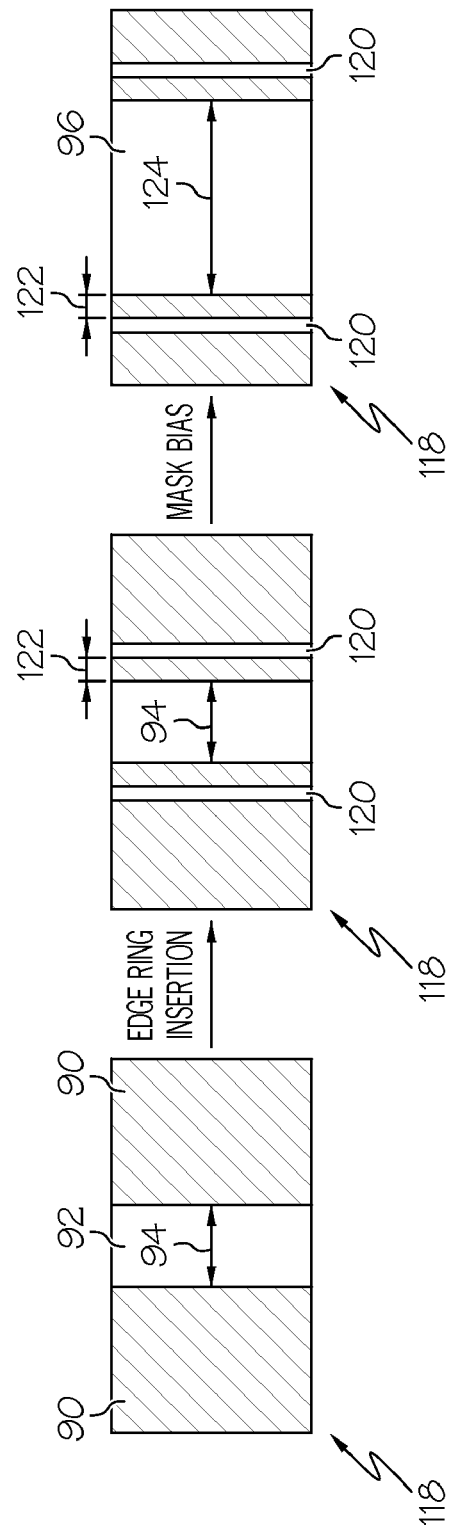

In contrast to the placement of the SRAF, the placement of the sub-resolution edge rings in accordance with an embodiment of the invention is fixed in relation to the edge of the mask opening as illustrated in FIG. 8. In accordance with this embodiment the fabrication of mask 118 begins as in FIG. 6 by defining a design target for a region within an IC that is to be fabricated. An initial mask geometry is determined for the region having a mask opening. Sub-resolution edge rings 120 are then inserted at a predetermined, fixed distance from the edge of the mask opening as determined by lithographic simulation and as indicated by arrows 122. The width of the sub-resolution edge rings are also determined by lithographic simulation. Following the insertion of the sub-resolution edge rings, mask biasing relative to the design target is applied, causing the mask opening to expand to a width indicated by double headed arrow 124. Despite the mask biasing, the spacing of the sub-resolution edge ring, relative to the edge of the mask opening remains fixed at a distance indicated by arrows 122. The sub-resolution edge ring is thus able to provide a transition region juxtaposed between the opaque mask material and the transparent mask opening. A lithographic mask is generated that incorporates the sub-resolution edge rings and the mask biasing.

Figure 9:
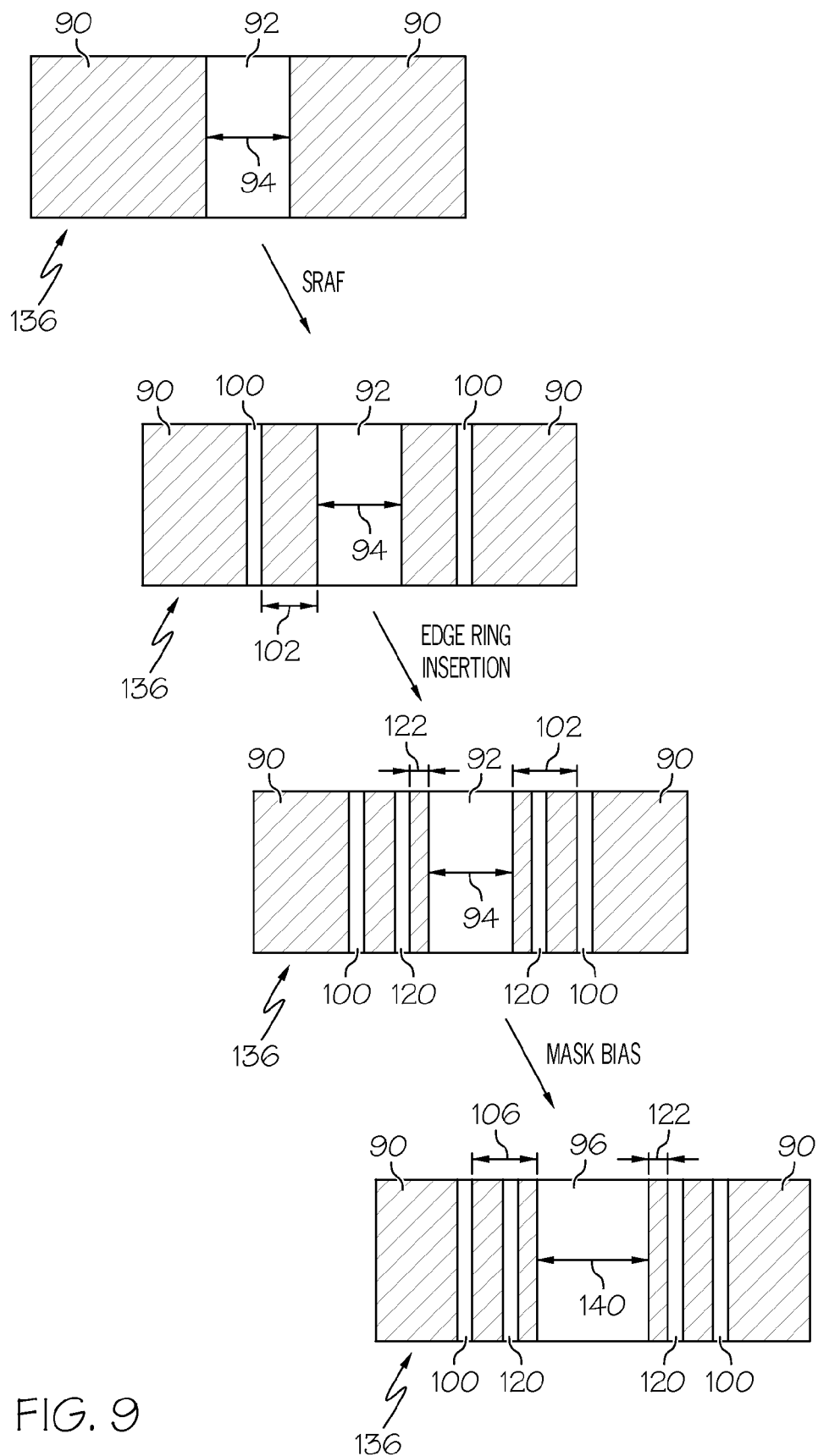

As illustrated in FIG. 9, in accordance with a further embodiment, the use of sub-resolution edge rings can be combined with SRAF in fabricating a photolithographic mask 136. As with the masks illustrated in FIGS. 6-8, the mask fabrication begins by defining a design target 94, proceeds with the insertion of SRAF 100 and then the insertion of sub-resolution edge rings 120 spaced apart from the mask opening by a fixed distance 122. The mask design is completed by applying mask biasing to achieve a mask opening 96 having a width indicated by double headed arrow 140 in the final mask 136. In the final mask the sub-resolution edge rings 120 are spaced apart from the mask opening 96 by a fixed distance indicated by arrows 122. The SRAF are spaced apart from the design target by a distance indicated by arrows 102 and from the mask opening 96 by a distance represented by arrows 106. The distance represented by arrows 102 is usually different than the distance represented by arrows 106 and is not known in advance. The width and spacing of the sub-resolution edge rings, determined by simulation, achieve a smoothing of the transition from opaque region to transparent region and serve to avoid a substantial dip in image intensity at the surface of a photoresist layer.

In accordance with one embodiment a rule table is established that defines the optimum sub-resolution edge ring width and spacing from an associated mask opening for a range of initial design target line widths and line spacings. The rule table is populated by simulating various combinations of ring width and spacing. The optimization metrics are the degree of image intensity dip, edge ring printability, and image quality. The rule table can also be populated by semiconductor experiment; that is, using a range of mask options to implement patterns in a layer overlying a semiconductor substrate.

In accordance with another embodiment the step of inserting a sub-resolution edge ring into a mask geometry can be done by an iterative process. After determining a design target a width and spacing are selected for a sub-resolution edge ring. Lithographic simulation is applied to determine a simulated target geometry and the simulated target geometry is compared to the design width. A new width and spacing are selected for the sub-resolution edge ring and the simulation is repeated. The iterative procedure repeats until the simulated target geometry is substantially identical to the design target and the image intensity dip is minimized. As a further step, mask bias and SRAF placement can also be included in the iterative process.

In accordance with an embodiment the techniques discussed above, including inserting a transition region, which may be a sub-resolution edge ring, at the edge of a transparent mask region, are utilized to design a lithographic mask. The design is then used to generate a lithographic mask which is used in the fabrication of a semiconductor integrated circuit (IC). FIGS. 10-13 illustrate, in cross sectional views, methods for fabricating a portion of an IC using such a lithographic mask. For purposes of illustration only, but without limitation, the method described will illustrate the fabrication of a MOS IC. The method, of course, can be applied to the fabrication of any type of IC.

Figure 10:
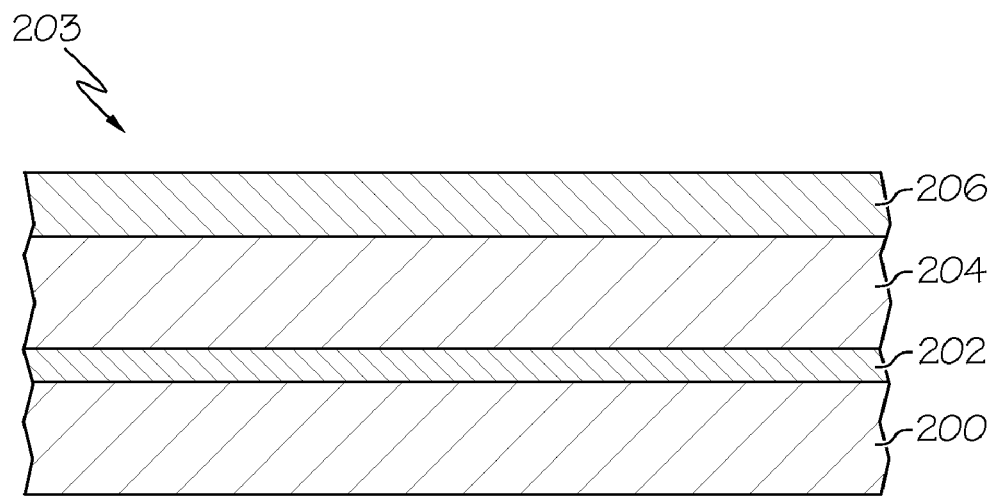
FIGS. 10-13 illustrate, in cross section, method steps for fabricating a semiconductor IC.

Various steps in the fabrication of semiconductor devices are well known and so, in the interest of brevity, many conventional steps will only be mentioned briefly herein or will be omitted entirely without providing the well known process details. As illustrated in FIG. 10, the method begins by providing a semiconductor substrate 200 upon which the IC 203 is to be fabricated. Semiconductor substrate 200 can be silicon or other semiconductor material commonly used for the fabrication of integrated circuits. Overlying the semiconductor substrate is a layer of gate insulator 202 and a layer of polycrystalline silicon 204. A layer of photoresist 206, preferably a layer of positive photoresist is applied overlying the layer of polycrystalline silicon. Although not illustrated, other layers such as antireflective coatings, etch stop layers, and the like may also be formed overlying the semiconductor substrate.

Figure 11:
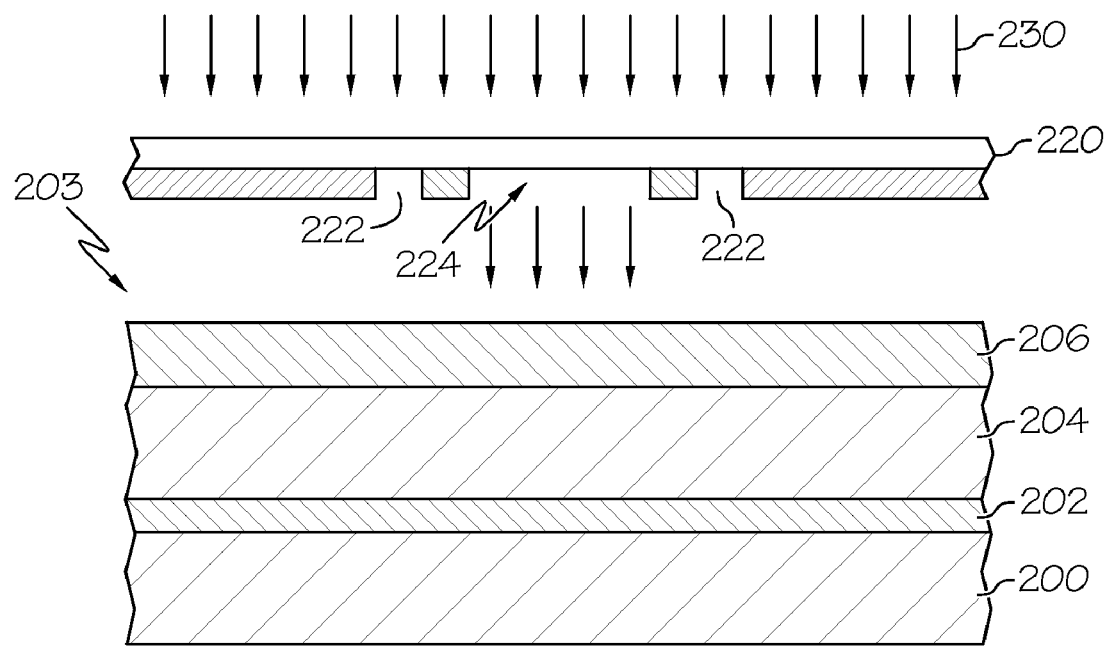

As illustrated in FIG. 11, a lithographic mask 220 having sub-resolution edge rings 222 and mask opening 224 designed as described above is positioned overlying the layer of photoresist. Although lithographic mask 220 is illustrated in spaced apart relationship to photoresist layer 206, the mask may be in direct contact with the photoresist, or may be positioned above a projection lens system (not illustrated). As illustrated by arrows 230, the photoresist layer is exposed to illumination that passes through mask opening 224. The provision of sub-resolution edge rings 222 avoids a dip in image intensity in the center of the mask opening by the illumination striking the photoresist layer.

Figure 12:
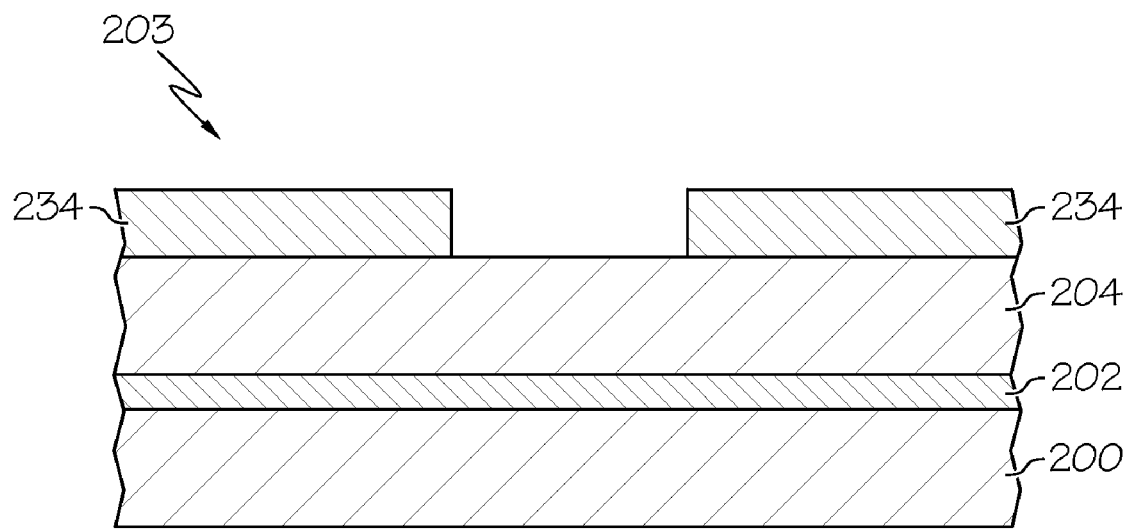

The method continues as illustrated in FIG. 12 by developing the exposed photoresist layer. The exposed portion of the photoresist is soluble in a photoresist developer solution and is removed by the developer. The unexposed portion 234 of the photoresist is not soluble and remains on the polycrystalline silicon as a process mask. Because the sub-resolution edge rings prevent a significant dip in image intensity at the center of the mask opening, the photoresist in the center of the opening is fully exposed and can be removed without leaving a photoresist scum or residue.

Figure 13:
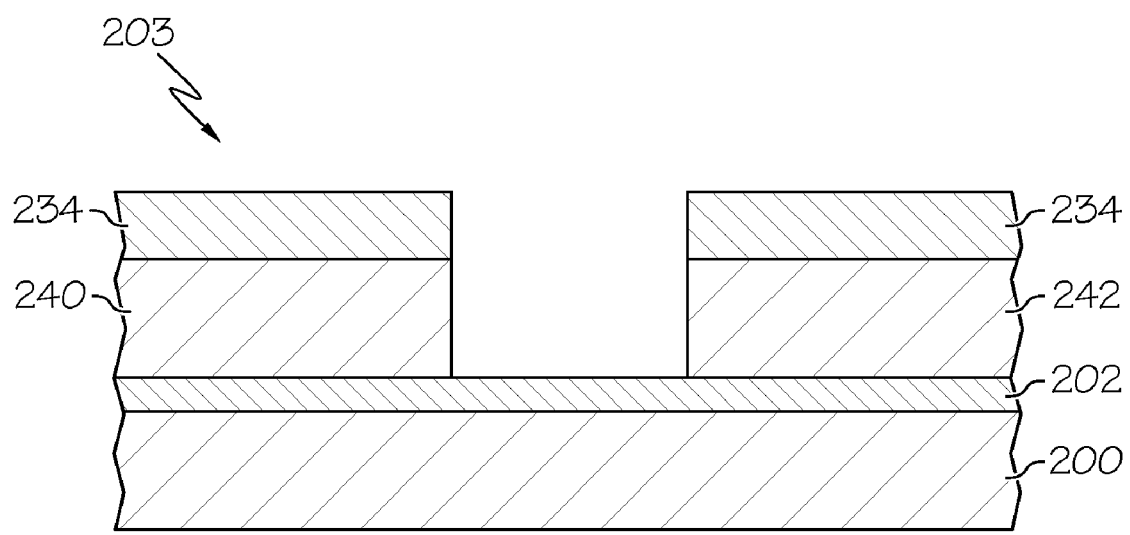

The unexposed portion 234 of the photoresist can be used as an etch mask, ion implantation mask, or the like. As illustrated in FIG. 13, the process mask is used as an etch mask to etch the polycrystalline silicon to form two spaced apart polycrystalline silicon gate electrodes 240 and 242. Lacking any photoresist scum or residue, the polycrystalline silicon is cleanly etched with out any polycrystalline stringers that might decrease yield of the circuit. After etching the exposed photoresist is removed.

Additional steps, both before and after the method steps illustrated in FIGS. 10-13, of course, as is well known by those of skill in the art, will be taken to complete the IC. Those steps are believed to be well known and need not be described here.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating a semiconductor integrated circuit (IC) comprising:
    determining a design target for a region within the IC;
    determining an initial mask geometry for the region having a mask opening responsive to the design target;
    inserting a sub-resolution edge ring into the mask geometry, the sub-resolution edge ring having a predetermined, fixed spacing to an edge of the mask opening;
    inserting a mask bias adjusting the mask opening;
    generating a lithographic mask in response to inserting the sub-resolution edge ring and the mask bias;
    forming a layer of material overlying a semiconductor substrate upon which the IC is to be fabricated;
    applying a layer of photoresist overlying the layer of material;
    exposing the layer of photoresist through the lithographic mask;
    developing the layer of photoresist; and
    performing a process step on the layer of material using the layer of photoresist as a mask.

2. The method of claim 1 wherein inserting the sub-resolution edge ring comprises inserting a transparent region having a width substantially equal to the fixed spacing.

3. The method of claim 1 wherein the design target comprises a transparent opening bordered by a pair of opaque stripes and wherein inserting a sub-resolution ring comprises modeling to reduce image intensity sink in the transparent opening during exposing of the layer of photoresist.

4. The method of claim 3 wherein inserting a sub-resolution edge ring comprises determining, in response to the modeling, a width for the sub-resolution edge ring and the fixed spacing of the sub-resolution edge ring from the edge of the mask opening.

5. The method of claim 1 further comprising:
determining a rule table of initial mask size as a function of design target to determine sub-resolution edge ring width and spacing in response to lithographic simulation; and
inserting the sub-resolution edge ring into the mask geometry based on selection from the rule table.

6. The method of claim 1 wherein inserting a sub-resolution edge ring comprises:
selecting a sub-resolution edge ring width and spacing and selecting a mask bias;
applying lithographic simulation to determine a simulated target geometry; and
iteratively repeating until the simulated target geometry is substantially identical to the design target.

7. The method of claim 6 further comprising inserting a standard sub-resolution assist feature (SRAF) into the mask geometry.

8. The method of claim 1 wherein forming a layer of material comprises depositing a layer of polycrystalline silicon and wherein performing a process step comprises etching the layer of polycrystalline silicon to form a pair of spaced apart MOS gate electrodes.

9. The method of claim 1 wherein inserting a mask bias comprises:
determining a mask bias based on a method selected from the group consisting of rule based selection, simulation based modeling, and combinations thereof.

* * * * *